United States Patent [19]
Larnac et al.

[11] Patent Number: 5,695,830
[45] Date of Patent: Dec. 9, 1997

[54] PROCESS FOR IMPROVING THE OXIDATIVE STABILITY OF A COMPOSITE MATERIAL HAVING A FIBROUS REINFORCEMENT AND A GLASS, GLASS-CERAMIC OR CERAMIC MATRIX

[75] Inventors: Guy Larnac, Saint Medard en Jalles; Frédéric Saugnac, Pessac, both of France

[73] Assignee: Aerospatiale Societe Nationale Industrielle, Paris, France

[21] Appl. No.: 272,748

[22] Filed: Jul. 11, 1994

[30] Foreign Application Priority Data

Jul. 12, 1993 [FR] France ................... 93 08551

[51] Int. Cl.[6] .......... C23C 16/00; B32B 18/00; C04B 35/56; C04B 35/58
[52] U.S. Cl. .......... 427/576; 427/215; 427/217; 427/248.1; 427/250; 427/562; 427/569; 427/577; 501/95; 501/96
[58] Field of Search .......... 501/95, 96; 427/562, 569, 577, 576, 215, 217, 248.1, 250

[56] References Cited

U.S. PATENT DOCUMENTS 5,484,655  1/1996  Lau et al. ................... 428/367

FOREIGN PATENT DOCUMENTS 0 095 433  11/1983  European Pat. Off.
0 517 463 A1  12/1992  European Pat. Off.

OTHER PUBLICATIONS

Chemical Abstracts, vol. 117, No. 4, Jul. 27, 1992, Columbus, Ohio, U.S. Schachner et al., "CVD of Aluminum Nitride on Whisker Substrates"; p. 372.

Primary Examiner—Richard Weisberger
Attorney, Agent, or Firm—Nikaido, Marmelstein, Murray & Oram LLP

[57] ABSTRACT

A reinforcing fiber of the non-oxide ceramic type or of carbon to be used in the manufacture of a composite material with a glass, glass-ceramic or ceramic matrix, which composite exhibits good oxidative stability, is treated using a process comprising the steps consisting of: if necessary, oxidizing the fiber superficially or depositing thereon a layer of the same composition but including oxygen; placing the fiber in a chemical vapor deposition vessel; carrying out a pre-treatment at a temperature of 850° to 1250° C., in the presence of hydrogen, at a pressure of 50 to 300 mbar; injecting a mixture of neutral carrier gas and ammonia; stopping the injection and adjusting the pressure to a value of 1 to 10 mbar; injecting $AlCl_3$ in a neutral diluting gas; producing on the fiber a deposit of AlN by simultaneously injecting a mixture of $AlCl_3$ and a neutral carrier gas, and a mixture of $NH_3$ and a neutral carrier gas, until the desired thickness of AlN is obtained; after stopping injection, cooling with a stream of neutral gas; and recovering the fiber.

16 Claims, 2 Drawing Sheets

PROCESS FOR IMPROVING THE OXIDATIVE STABILITY OF A COMPOSITE MATERIAL HAVING A FIBROUS REINFORCEMENT AND A GLASS, GLASS-CERAMIC OR CERAMIC MATRIX

BACKGROUND OF THE INVENTION

1. Field of the Invention

The invention relates to improving the oxidative stability of composite materials having a ceramic or carbon fiber reinforcement and a matrix of the glass, glass-ceramic or ceramic type.

It relates to a process for treating a reinforcing fiber of a non-oxide ceramic type or of carbon which can be used in the manufacture of a composite material having a glass, glass-ceramic or ceramic matrix possessing a good oxidative stability up to temperatures in the vicinity of 1200° C., over a prolonged period.

2. Description of the Prior Art

Composite materials with a ceramic or carbon fiber reinforcement and a glass, glass-ceramic or ceramic matrix are excellent candidates for thermostructural applications, for example at intermediate temperatures of 500° C. in the case of composites with glass matrices and up to 1200° C. in that of composites with glass-ceramic matrices. The development of these composite materials has accelerated in recent years on account of their increasingly numerous potential applications, particularly in the fields of aeronautics and space technology.

Examples of the manufacture of such composites are given, for instance, in the article by J. J. Brennan and K. M. Prewo, J. Mat. Science 17 (1982) pages 2371–2383, as well as in U.S. Pat. No. 4,341,826.

The silicon carbide fiber, SiC, manufactured by NIPPON CARBON Co and used as a reinforcement in these composites, develops a surface layer of carbon when brought to a temperature of over 1000° C. in an inert atmosphere. When composites such as those disclosed in the prior art are manufactured, this layer of carbon is formed at the interface between the fiber and the matrix. The mechanisms of its formation are described, in particular, in the article by R. F. Cooper and K. Chyung, J. Mat. Science, 22, (1987), pages 3148–3160. This layer of carbon confers on the composite a low interfacial shearing stress value. As a result, the composite, when subjected to mechanical stress in a non-oxidizing environment until it fails, exhibits a non-brittle type of behavior. The formation of interfacial carbon is peculiar to the SiC fiber used, which is marketed under the name of Nicalon®. It does not occur, for example, in the case of the SiCN fiber marketed by DOW-CORNING under the reference HPZ, as reported by J. J. Brennan in his article entitled Glass and Glass-Ceramic Matrix Composites, pages 222–259 of the work by K. S. Mazdiyasni, "FIBER REINFORCED CERAMIC COMPOSITES", Materials, Processing and Technology, Noyes Publications, 1990. In this case, the interfacial shearing stress is very high and failure occurs in a brittle manner.

Various methods intended to adjust the values of the interfacial shearing stresses have been developed. Thus, U.S. Pat. No. 4,485,179 discloses, for example, the addition of $Nb_2O_5$ or $Ta_2O_5$ to the matrix composition. These oxides react with the carbon of the fiber and are transformed into carbides that are theoretically more resistant to oxidation than carbon. Another technique consists in depositing on the fiber, before the composite is prepared, a layer of pyrolytic carbon or boron nitride (BN), as disclosed in French patent 2,567,874 and U.S. Pat. No. 4,605,588. This technique can be applied to fibers other than the SiC fiber Nicalon®. The low interfacial shearing stress results from the ability of the crystalline planes of the graphite or BN deposits to slide. The efficiency of these deposits is limited, however, since the graphite oxidizes in air from 550° C. upwards. As to the BN, this oxidizes from 800° C. upwards. The boric anhydride, $B_2O_3$, thus formed can, owing to its low melting temperature, lead to considerable flow in the area of the interface.

Patent application EP 0,366,234 discloses a process for coating fibers with a two-dimensional deposit of silicate possessing a mica type flaky crystalline structure. This method gives rise to non-brittle failure behavior on the part of the composites produced with this fiber. However, it appears that such silicate compositions possess elements such as lithium or sodium, which are known for the fact that they migrate towards the inside of fibers of the Nicalon® type and impair their mechanical properties. Another drawback is that it is necessary to monitor crystallization of the deposit to make sure that it in the desired crystalline form to ensure the cleavage of the crystalline planes. This drawback complicates the manufacture of such composites.

Solutions aimed at remedying the drawbacks of the prior art described above have already been proposed.

French patent application 2,673,939 proposes, with a view to imparting toughness to a ceramic composite formed of "non-oxidic" ceramic fibers immersed in a ceramic matrix, to treat the fibers, before the composite is manufactured, with an organometallic solution, to evaporate the solvent and to oxidize the residual organic components so as to obtain on the fibers a ductile or flexible coating of pure noble metal that attenuates the cracks that are developing in the matrix.

This technique uses a costly coating and necessitates several steps.

French patent application 2,673,937 proposes providing the reinforcing fibers with a multi-layer ceramic coating surrounding each fiber and in which the multiple layers are not bonded or are separable. This process is also complex.

French patent application 2,673,938 proposes providing the reinforcing fibers with a porous coating, the pores of which are preferably "kept empty" by means of a non-porous obturating layer formed on the porous coating.

French patent application 2,673,940 proposes coating the reinforcing fibers with a pre-cracked coating.

These four patent applications propose, in a very general manner, solutions that are often complex, that are not supported by examples, and that do not take into account the problem of the adhesion of the coating on the fiber.

DISCLOSURE OF THE INVENTION

The object of the invention is to develop a process making it possible to produce, in a simple manner, on the surface of a reinforcing fiber, prior to the forming of a composite, a deposit having low adherence to the fiber, such that the composite obtained has good oxidation resistance up to temperatures of 1200° C. and for prolonged periods.

This objective is achieved according to the invention, which provides a process for treating the fibers suitable for imparting the requisite properties thereto through depositing a layer of aluminum nitride (AlN) under special conditions.

More precisely, the invention provides a process for treating a reinforcing fiber of a non-oxide ceramic type or of carbon that can be used in the manufacture of a composite material with a glass, glass-ceramic or ceramic matrix exhibiting good oxidative stability up to temperatures in the vicinity of 1000° C., for a prolonged period, which process essentially comprises the successive steps consisting in:

(a) if necessary, oxidizing the fiber superficially or depositing thereon a layer of the same composition but including oxygen;

(b) placing the fiber in a chemical vapor deposition vessel, in an arrangement such that the gases can circulate freely within the vessel;

(c) carrying out a pre-treatment of the fiber in the vessel at a temperature selected in the 850° to 1250° C. range, in the presence of hydrogen, at a pressure of 50 to 300 mbar;

(d) injecting into the vessel a mixture of neutral carrier gas and ammonia in a volume ratio of 20 to 60;

(e) stopping injection of the mixture and setting the pressure inside the vessel to a value of 1 to 10 mbar;

(f) injecting into the vessel aluminum chloride in a neutral diluting gas;

(g) producing a deposit of aluminum nitride on the fiber by simultaneously injecting into the vessel a mixture composed of aluminum chloride and neutral carrier gas, in a volume ratio of 0.05 to 0.3, and a mixture composed of ammonia and a neutral carrier gas, in a volume ratio of 0.01 to 0.05, the two mixtures being used in a volume ratio of 0.5 to 2, until the desired thickness of aluminum nitride is obtained;

(h) stopping the injection of the gaseous mixtures;

(i) cooling the vessel with a stream of neutral gas; and (j) extracting the fibers thus treated from the vessel.

Fibers that can be treated using the aluminum nitride (AlN) depositing process according to the invention are fibers of a non-oxide type such as, for example, a silicon carbide (SiC) fiber, a silicon carbonitride fiber (SiCN), a silicon nitride fiber ($Si_3N_4$), or a carbon fiber.

The SiC fibers and the SiCN fibers are particularly suitable for this treatment. As SiC fibers, mention can be made of the Nicalon® fiber made by the NIPPON CARBIDE company and of the Tyranno® fiber made by UBE, while, as an SiCN fiber, mention can be made of the HPZ fiber made by DOW-CORNING.

The Nicalon® fiber has a non-negligeable percentage of free carbon and oxygen. According to the invention, the carbon and the oxygen should be kept on the surface of the SiC fiber in order to favor low adhesion of the AlN deposit to the SiC. Thanks to this low adhesion, the composites prepared using the fiber thus treated exhibit non-brittle behavior.

When it is wished to treat a fiber that does not normally have oxygen on its surface, it should be oxidized or provided with a deposit of the same composition containing oxygen.

These treatments can be carried out using conventional techniques, in particular chemical vapor deposition (CVD), as in the case of AlN deposition.

The CVD process consists in placing at least one volatile compound, in vapor phase, in contact with the surface to be covered, so as to cause a chemical reaction yielding at least one solid product. The deposition chamber is a reaction vessel open at both ends, through which passes a gas flow generally formed by a vector gas entraining the solid precursor gas or gases. This circulation of gases takes place most often at reduced pressure and the activating energy required to trigger the reaction is obtained by heating the reaction chamber.

So that the gases can circulate freely in the CVD vessel, the fiber can be wound around an openwork type graphite implement.

The conditions for treating the fiber in the CVD vessel, in particular the flow rates of the gases used, depend on the structure, and especially on the dimensions, of the said vessel.

One CVD vessel suitable for implementing the process according to the invention is described in the detailed example that follows, the appropriate gas flows being indicated.

The Applicants have shown that, in order to obtain adequate fiber-AlN adhesion, it is essential to subject the fiber to a pre-treatment to prepare its surface after, if necessary, oxidizing it superficially or providing it with a coating of the same type containing oxygen. This pre-treatment is carried out under the conditions indicated above.

The pre-treatment of the fiber in the presence of hydrogen is advantageously carried out for 10 to 60 minutes.

The neutral carrier gas used in a mixture with ammonia is advantageously nitrogen.

The mixture of neutral carrier gas and ammonia in a volume ratio of 20 to 60 is advantageously injected for 10 to 60 minutes.

The neutral diluting gas for the aluminum chloride is advantageously helium.

The aluminum chloride is advantageously present in a proportion of 45% by volume in the neutral diluting gas.

The time for which the aluminum chloride in a neutral diluting gas is injected is advantageously 5 to 20 minutes.

The aluminum nitride, AlN, is then deposited from its gaseous precursors, namely aluminum chloride, $AlCl_3$ and ammonia, $NH_3$.

The duration of the AlN deposition step depends, for a given vessel and for given gas flow rates, upon the thickness of the AlN to be deposited. This thickness is generally from 0.1 to 1 µm, and is preferably from 0.2 to 1 µm. A deposit thickness of approximately 0.2 µm is generally sufficient to impart the requisite properties to the fiber. If the thickness of the deposit exceeds 1 µm, bridging can occur between the monofilaments forming the tow of fiber, which makes the tow very brittle, thus making it difficult to manipulate.

The neutral carrier gas used in the aluminum nitride deposition step is advantageously nitrogen.

The stream of neutral gas used to cool the vessel is advantageously a stream of nitrogen.

The fibers obtained using the process according to the invention can be used for manufacturing composites with a fibrous reinforcement and a glass, glass-ceramic or ceramic matrix according to known processes for the manufacture of such composites, in particular those described in the references given above.

Examples of processes that can be used to advantage are disclosed in French patent applications 2,655,327 and 2,682,674, as well as in the article by P. Lespade et al., in: SCIENCE AND TECHNOLOGY OF NEW GLASSES, Proceedings of the International Conference of Science and Technoloy of New Glasses, Tokyo, 1991, pages 147–152.

Figure 1:
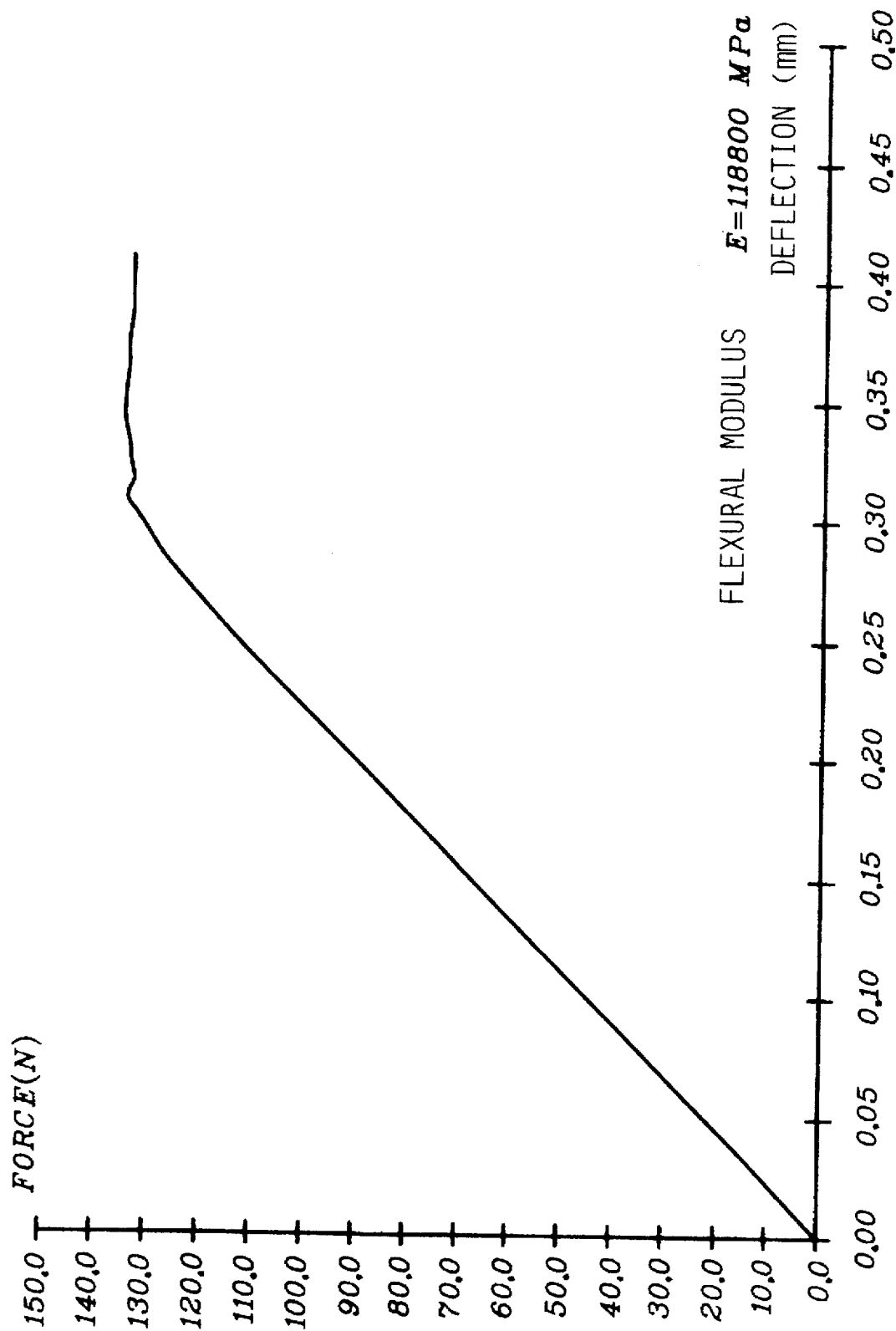
FIG. 1: the behavior (3 point bending test at ambient temperature, in air; flexural modulus E=118,800 MPa) of a composite obtained, as described in the following example, from an SiC Nicalon® fiber coated with a layer of 0.2 µm thick AlN and comprising a matrix of MgO, $Al_2O_3$, $SiO_2$, $Li_2O$ (MAS-L)
Figure 2:
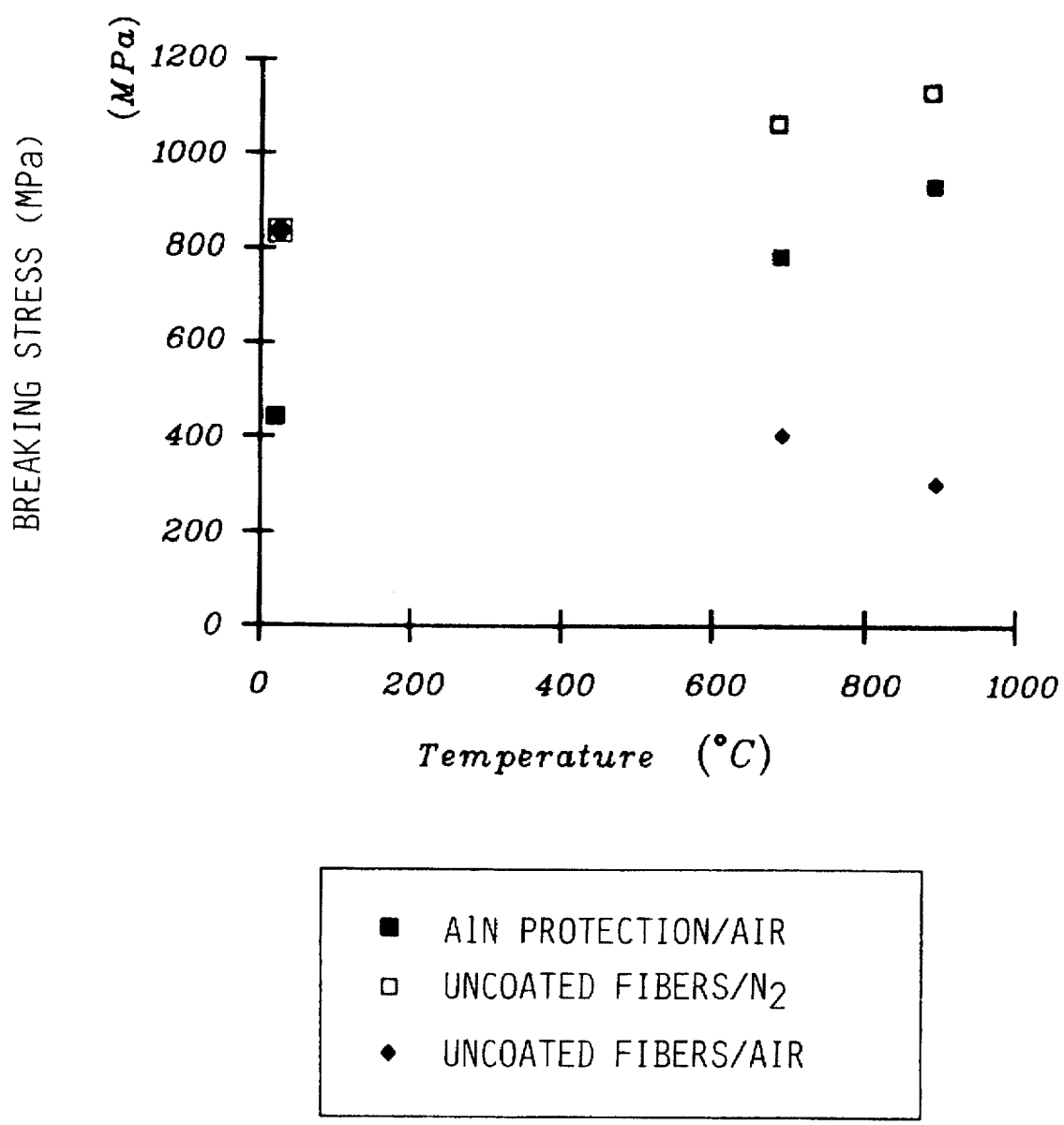
FIG. 2: the evolution, as a function of temperature, of the breaking stress for three composites with an MAS-L matrix including, as a fibrous reinforcement, Nicalon® SiC fibers, under the following respective conditions.

fibers provided with an AlN protective coating: test conducted in air;

uncoated fibers: test conducted in nitrogen atmosphere; and uncoated fibers: test conducted in air.

It was observed that, in air, with AlN coated fibers, the breaking stress increased with temperature, approaching that of a composite with uncoated fibers in a nitrogen atmosphere, while, in air, with uncoated fibers, breaking stress decreased swiftly and considerably.

The efficiency of the AlN coating in improving the oxidative stability of a composite material is thus clearly demonstrated.

The composite prepared from non-coated SiC fibers has, at ambient temperature, a high breaking stress value as well as considerable deformation (approximately 1%). Such behavior originates from the formation, at the fiber-matrix interface, of a layer of carbon several nanometers thick. When it is tested at higher temperatures, in air, damage to the composite exposes this layer of carbon, which oxidizes. The behavior of the composite then becomes of the brittle type.

The composite prepared with AlN coated fibers exhibits non-brittle behavior over the entire temperature range in which it has been tested. In this case, the non-brittle behavior results from the low adhesion of the AlN to the SiC fiber. When the temperature rises, the breaking stress increases, as the hooping applied to the fiber by the coating and the matrix tends to decrease, thus imparting to the composite a behavior akin to that, at ambient temperature, of the material as prepared with non-coated fibers.

The invention is described in greater detail taking the following illustrative example.

EXAMPLE

Manufacture of a composite material having an MgO-$Al_2O_3$-$SiO_2$-$Li_2O$ (MAS-L) matrix reinforced by silicon carbide (SIC) fiber coated with a deposit of aluminum nitride (AlN)

Treatment of the fiber according to the invention

SiC fiber manufactured by the NIPPON CARBON company and marketed under the name of NICALON® NLM 202, wound around an openwork graphite implement, was treated in a chemical vapor deposition (CVD) vessel.

This vessel was an induction heated oven. The heating area had a diameter of 600 mm and a height of 600 mm. A revolving sole rotated the implement supporting the fiber, which enabled the homogeneity of the treatment to be improved.

The AlN was deposited on the fiber in three steps:
  heat treatment
  transition phase
  deposition properly speaking.

Heat treatment

After the implement supporting the fiber had been placed in the oven, the temperature of the latter was brought to a value of 850° to 1200° C., with a hydrogen flow rate of 1 to 7 l/min and a pressure of 50 to 300 mbar. The temperature chosen was maintened for 10 to 60 minutes (stage).

Transition phase

A mixture of nitrogen and ammonia was then fed into the oven at a rate of 0.1 to 0.5 l/min for 10 to 60 minutes.

Injection of the gas mixture was then stopped and the internal pressure of the oven was adjusted to approximately 2 mbar. Aluminum chloride in a proportion of 45% by volume in helium was then injected for 5 to 20 minutes, at the rate of 0.1 to 1 l/min.

AlN deposition

Deposition was carried out by simultaneously injecting the following two gas mixtures into the oven:

1st. mixture
    $AlCl_3$ at a rate of 5 to 40 l/h, and
    $N_2$ at a rate of 1 to 10 l/min.

2nd. mixture:
    $NH_3$ at a rate of 0.01 to 0.1 l/min, and
    $N_2$ at a rate of 1 to 10 l/min.

The deposition time can vary from 30 minutes to several hours, depending on the AlN thickness desired, this being preferably between 0.1 and 1 μm.

When the desired thickness of AlN was obtained, injection of the gas mixtures was stopped and the oven was cooled with a stream of nitrogen.

The fiber thus coated was removed from the oven and was unwound, and was then used to manufacture the composite.

Preparation of the composite

The composite was manufactured according to a known technique such as described, for example, in French patent applications 2,655,327 and 2,682,674, but without the size removal treatment.

The fiber was impregnated by being passed through a slip formed (by weight) of:
  poly(methyl methacrylate) (PMMA): 5%
  MAS-L glass powder: 35%
  monochlorobenzene: 60%.

It was then wrapped jointedly over a multi-sided mandrel. After stoving at 80° C., sheets were cut off to the dimensions of the composite material to be produced and placed in a pressing mold, with the fibers unidirectionally orientated.

The whole was subjected to the following densifying and ceramizing heat treatment:

temperature rise in a vacuum (20 mbar) and with a piston pressure of 4 MPa, up to 1025° C. in 245 minutes, with a first stage of 30 minutes at 280° C. after 60 minutes, a second stage of 30 minutes at 550° C. after 135 minutes and a third stage of 30 minutes at 830° C. after 195 minutes, gradual temperature rise up to 1050° C., with the introduction of nitrogen, in a 5 minutes, temperature rise in a nitrogen atmosphere (1000 mbar) up to 1325° C. in 55 minutes, and then up to 1340° C. in 5 minutes, increasing the piston pressure up to 20 MPa, temperature reduction back to 1325° C. in 8 minutes, at a piston pressure of 20 MPa, and at a nitrogen pressure of 1000 mbar, gradual cooling down to 1000° C., in 43 minutes, at a piston pressure of 20 MPa, and at a nitrogen pressure of 1000 mbar, complete releasing of piston pressure in 5 minutes with slight cooling of the product, the nitrogen atmosphere being maintained, The composite obtained after complete cooling had a volume percentage of fibers of 40% (Vf=0.4). The fibers were aligned unidirectionally.

We claim:

1. A process for treating a non-oxide ceramic or carbon reinforcing fiber, which can be used in the manufacture of a composite material having a glass, glass-ceramic or ceramic matrix exhibiting good oxidative stability up to temperature the vicinity of 1200° C., for a prolonged period, which process comprises:

(a) if the fiber has no oxygen on its surface, oxidizing the fiber superficially or depositing thereon a layer of the same composition but including oxygen;

(b) placing the fiber in a chemical vapor deposition vessel, in a arrangement such that the gases can circulate freely within the vessel;

(c) carrying out a pre-treatment of the fiber in the vessel under conditions that keep oxygen on its surface;

(d) injecting into the vessel a mixture of neutral carrier gas and ammonia in a volume ratio of 20 to 60;

(e) stopping injection of the mixture and setting the pressure inside the vessel to a value of 1 to 10 mbar;

(f) injecting into the vessel aluminum chloride in a neutral diluting gas:

(g) producing a deposit of aluminum nitride on the fiber by simultaneously injecting into the vessel a mixture composed of aluminum chloride and neutral carrier gas, in a volume ratio of 0.05 to 0.3, and a mixture composed of ammonia and a neutral carrier gas, in a volume ratio of 0.01 to 0.05, the two mixtures being used in volume ratio of 0.5 to 2, until a thickness of 0.1 to 1 µm of aluminum nitride is obtained;

(h) stopping the injection of the gaseous mixtures;

(i) cooling the vessel with a stream of neutral gas; and (j) extracting the fibers thus treated from the vessel.

2. A process according to claim 1, wherein the fiber is an SiC, SiCN, $Si_3N_4$ or carbon fiber.

3. A process according to claim 2, wherein the fiber is an SiC or SiCN fiber.

4. A process according to claim 1, wherein the pre-treatment of the fiber in the presence of hydrogen is carried out for 10 to 60 minutes.

5. A process according to claim 1, wherein the neutral carrier gas used in a mixture with ammonia is nitrogen.

6. A process according to claim 1, wherein the mixture of neutral carrier gas and of ammonia in a volume ratio of 20 to 60 is injected for 10 to 60 minutes.

7. A process according to claim 1, wherein the neutral diluting gas for the aluminum chloride is helium.

8. A process according to claim 1, wherein aluminum chloride is present in a proportion of about 45% by volume in the neutral diluting gas.

9. A process according to claim 1, wherein the time for which the aluminum chloride in a neutral diluting gas is injected is 5 to 20 minutes.

10. A process according to claim 1, wherein aluminum nitride is deposited until a thickness of 0.2 to 1 µm is obtained.

11. A process according to claim 10, wherein aluminum nitride is deposited until a thickness of about 0.2 µm is obtained.

12. A process according to claim 1, wherein the neutral carrier gas used in the aluminum nitride deposition step is nitrogen.

13. A process according to claim 1, wherein the stream of neutral gas used to cool the vessel is a stream of nitrogen.

14. A process for the manufacture of a composite material with a fibrous reinforcement and a glass, glass-ceramic or ceramic matrix, which comprises the use of a fiber treated by implementing the process according to claim 1.

15. The process of claim 14 wherein the glass, glass-ceramic or ceramic matrix is and $MgO$—$Al_2O_3$—$SiO_2$—$Li_2O$ matrix.

16. The process of claim 1, wherein the pretreatment of the fiber is carried out at a temperature selected in the 850° to 1250° C. range, in the presence of hydrogen, at a pressure of 50 to 300 mbar.

* * * * *